(12) United States Patent
Traeber

(10) Patent No.: US 7,062,701 B2
(45) Date of Patent: Jun. 13, 2006

(54) METHOD FOR STORING PATH METRICS IN A VITERBI DECODER

(75) Inventor: Mario Traeber, Munich (DE)

(73) Assignee: Infineon Technologies AG, Munich (DE)

( * ) Notice: Subject to any disclaimer, the term of this patent is extended or adjusted under 35 U.S.C. 154(b) by 615 days.

(21) Appl. No.: 09/798,263

(22) Filed: Mar. 2, 2001

(65) Prior Publication Data

US 2001/0037486 A1 Nov. 1, 2001

(30) Foreign Application Priority Data

Feb. 2, 2000 (DE) ................. 100 10 238

(51) Int. Cl.
*H03M 13/03* (2006.01)

(52) U.S. Cl. .............. 714/796; 714/795; 714/792; 375/262; 375/341

(58) Field of Classification Search ........... 714/752, 714/796, 795, 794, 791–792; 375/262, 341, 375/265

See application file for complete search history.

(56) References Cited

U.S. PATENT DOCUMENTS

| | | |
|---|---|---|
| 4,979,175 A | 12/1990 | Porter |
| 5,327,440 A | 7/1994 | Fredrickson et al. |
| 5,416,787 A | 5/1995 | Kodama et al. |
| 5,539,757 A | 7/1996 | Cox et al. |
| 6,148,431 A | 11/2000 | Lee et al. |
| 6,438,181 B1 * | 8/2002 | Setlur et al. ........... 375/341 |
| 6,622,283 B1 * | 9/2003 | Cohen ................. 714/794 |

FOREIGN PATENT DOCUMENTS

| | | |
|---|---|---|
| EP | 0 660 534 A2 | 6/1995 |
| EP | 0 720 303 | 7/1996 |
| EP | 1 024 604 A2 | 8/2000 |
| JP | 7-221655 | 8/1995 |
| JP | 07336239 | 12/1995 |
| JP | 2001-058766 | 3/2001 |
| JP | 2001-28550 | 8/2002 |
| KR | 1999-0078237 | 10/1999 |
| WO | WO 00/08768 | 2/2000 |
| WO | WO 01/03308 | 1/2001 |

OTHER PUBLICATIONS

Herbert David et al., "Scalable Architecures for High Speed Channel Decoding," Integrated Systems for Signal Processing, pp. 226-235 (1994).

(Continued)

*Primary Examiner*—Guy J. Lamarre
(74) *Attorney, Agent, or Firm*—Fish & Richardson P.C.

(57) ABSTRACT

For a Virerbi decoder, it is proposed to combine the butterfly structures of the corresponding trellis diagram in pairs in such a way that for each butterfly structure pair, the destination states of the two butterfly structures in the trellis diagram at the same time form starting states for two other butterfly structures. After the determination of the path metrics of the destination states one of the two butterfly structures of a butterfly structure pair, in each case the path metrics of those two destination states of this butterfly structure pair which at the same time form starting states of another butterfly structure are then stored in the form of a common memory word.

14 Claims, 4 Drawing Sheets

OTHER PUBLICATIONS

Korean Application No. 10-2001-0010906, issue date May 24, 2004, 2 pages.
Korean Office Action of May 24, 2004, 2 pages.

G.C. Clark & B.J. Cain, "Error Correction Coding for Digital Communication," Chapter 6, pp. 238-239, Plenum Press, 1981.

* cited by examiner

METHOD FOR STORING PATH METRICS IN A VITERBI DECODER

FIELD OF INVENTION

The present invention relates to a method for storing path metrics in a Viterbi decoder, and in particular, to Viterbi decoders in mobile radio receivers for decoding channel-coded mobile radio signals.

PRIORITY CLAIM

This application claims priority from German application 100 10 238.7, filed on Mar. 2, 2000, the contents of which are herein incorporated by reference.

BACKGROUND

In most known digital mobile radio receivers, a Viterbi decoder is used. A Viterbi decoder is a so-called maximum likelihood decoder, which is generally used for decoding channel-coded, and in particular convolutionally coded, mobile radio signals. During channel coding, the transmitter adds redundant information to the symbols to be transmitted in order to increase the transmission reliability. During the transmission of a mobile radio signal, however, noise is superposed on the signal. The task of the receiver consists, therefore, in using the reception sequence to identify, from all possible transmission sequences, that transmission sequence which corresponds with maximum likelihood to the actual transmission sequence. This task is undertaken by the Viterbi decoder.

The coding specification used during the channel coding can be described by a corresponding trellis diagram. By calculating so-called metrics, the Viterbi decoder determines that path of the trellis diagram which has the largest or smallest path metric, depending on the respective configuration of the decoder. Using this path of the trellis diagram, the decoded sequence can then be determined and output.

The principles of Viterbi decoding will be briefly explained in more detail below.

FIG. 4 illustrates, by way of example, a trellis diagram with in each case four different states at the instants t . . . t+3, which correspond for example to the bit states "00", "10", "01" and "11". Each symbol sequence is assigned to a corresponding path in the trellis diagram. In this case, a path comprises a sequence of branches between two temporally successive states. Each branch symbolizes a state transition between two temporally successive states. For example, the upper branch preceding from a state corresponds to a reception symbol with the binary "0" and the lower branch proceeding from the same state corresponds to a reception symbol with the binary value "1". Each of these state transitions to which a branch metric (BM) $\lambda_t$ is allocated corresponds to a transmission symbol. The branch metric $\lambda_t$ is defined as follows:

$$\lambda_t = |y_t' - r_t^2|$$

In this case, $r_t$ corresponds to the reception symbol at the instant t and $y_t'$ corresponds to the transmission symbol expected as a function thereof at the instant t.

Furthermore, a path metric $\gamma_t$, is allocated to each path through the trellis diagram up to the instant or time step t.

The trellis diagram shown in FIG. 4 is, in particular, a trellis diagram with a so-called "butterfly" structure. This means that in each case, two states of a time step t+1 of the trellis program are allocated two states of the preceding time step t+1, whose branches in each case lead to the first-mentioned states of the time step t+1, in each case two branch metrics of the branches proceeding from different states being identical. Thus, for example, the states which are shown in FIG. 4 and to which the path metrics $\gamma_t^{(1)}$, $\gamma_t^{(3)}$, $\gamma_{t+1}^{(2)}$ and $\gamma_{t+1}^{(3)}$ are allocated form a "butterfly" structure of this type, the branch metric for the branch from the state with the path metric $\gamma_t^{(1)}$ to the state with the path metric $\gamma_{t+1}^{(2)}$ corresponding to the branch metric $\lambda_t^{(3)}$ of the branch from the state with the path metric $\gamma_t^{(3)}$ to the state with the path metric $\gamma_{t+1}^{(3)}$, while on the other hand the branch metric of the branch from the state with the path metric $\gamma_t^{(1)}$ to the state with the path metric $\gamma_{t+1}^{(3)}$ corresponds to the branch metric $\lambda_t^{(1)}$ of the branch from the state with the path metric $\gamma_t^{(3)}$ to the state with the path metric $\gamma_{t+1}^{(2)}$. In this case, $\gamma_t^{(3)}$ generally designates the path metric allocated to the state s in the time step t, while $\lambda_t^{(3)}$ designates the branch metric of the state transition corresponding to the signal s at the instant t.

The Viterbi decoder must then use an algorithm corresponding to the trellis diagram to determine that path which has the best path metric. As a rule, this is by definition the path having the smallest path metric.

Each path metric of a path leading to a specific state is composed of the path metric of a temporally preceding state and the branch metric of the branch leading from this preceding state to the specific state. The consequence of this is that not all of the possible paths and path metrics of the trellis diagram have to be determined and evaluated. Instead, for each state and for each time step of the trellis diagram, in each case that path which has the best path metric up to that instant is determined. Only this path, which is designated as a "survivor path", and its path metric have to be stored. All other paths leading to this state can be disregarded. Accordingly, during each time step, there are a number of such survivor paths corresponding to the number of different states.

The above description makes it clear that the calculation of the path metric $\gamma_{t+1}^{(3)}$ depends on the path metrics of the preceding time step t, which are connected to the state via a branch. Accordingly, the calculation of the path metrics can be realized by a recursive algorithm which is undertaken by a so-called "Add Compare Select" unit (ACS unit) in a Viterbi decoder.

FIG. 5 illustrates the typical construction of a Viterbi decoder.

In addition to the ACS unit 2 with a memory or register 3, a branch metric unit (BMU) 1 and a survivor memory unit 4 are provided. The task of the branch metric unit is to calculate the branch metrics $\lambda_t^{(3)}$ which are a measure of the difference between a reception symbol and that symbol which engenders the corresponding state transition in the trellis diagram. The branch metrics calculated by the branch metric unit 1 are fed to the ACS unit 2 for determination of the optimal paths (survivor paths). The survivor memory unit 4 stores these survivor paths, so that finally decoding can be carried out using that survivor path that has the best path metric. The symbol sequence assigned to this path corresponds with maximum likelihood to the symbol sequence actually transmitted.

The ACS unit 2 comprises a plurality of processor elements. As a rule, each state of the trellis diagram is evaluated by a separate processor element. The task of each individual processor element is to select from two mutually competing paths (referred to as "competitor paths") that lead to a state of the trellis diagram the path (referred to as the "survivor path") having the best, i.e. smallest, path metric. The stored values for the survivor path leading to this state, together with its path metric, are then updated.

As is evident from the trellis diagram shown in FIG. 4, each state s, at the instant t+1, is connected to a corresponding preceding state via an upper branch and a lower branch. Consequently, in order to determine the survivor path corresponding to this state s, the path metric of the path leading to the state s via the upper branch must be compared with the path metric of the path leading to the state s via the lower branch, i.e. the task of each processor element consists in selecting, for the purpose of determining the survivor path with the path metric $\gamma_{t+1}^{(3)}$, either the path which leads via the preceding "upper" state with the path metric $\gamma_t^{(u)}$ and the "upper" branch with the branch metric $\gamma_t^{(u)}$ and whose path metric corresponds to the sum $\gamma_t^{(u)}+\lambda_t^{(u)}$, or the path which leads via the "lower" state with the path metric $\gamma_t^{(l)}$ and the "lower" branch with the branch metric $\gamma_t^{(l)}$ and whose path metric corresponds to the sum $\gamma_t^{(l)}+\lambda_t^{(l)}$.

Since each result $\gamma_t^{(s)}$ calculated for a state s in the time step t is at the same time the basis for the calculation of a path metric for a temporally succeeding state, the feedback, shown in FIG. 5, of the ACS unit 2 via the memory 3 is necessary, the calculated path metrics being buffered in the memory 3.

The structure of the memory 3 must be configured in accordance with the structure of the respective trellis diagram. During each symbol period, a number of path metrics corresponding to the number of states of the trellis diagram must be read from the memory 3 and written to the memory 3. For each butterfly of the trellis diagram, two states are processed simultaneously, so that two starting path metrics must be read from the memory 3 and two path metrics calculated therefrom must be written to the memory 3.

This gives rise, however, to the problem that the path metrics must not be overwritten before they have been read out.

In order to make this clearer, FIG. 6 illustrates a further trellis diagram with eight states. The trellis diagram has the butterfly structure already described, an exemplary butterfly being illustrated by broken lines and comprising the starting states $S_t$ No. 1 and 5 and the destination states $S_{t+1}$ No. 2 and 3. Consequently, for the calculation of the path metrics of the destination states No. 2 and 3, the path metrics of the starting states No. 1 and 5 must first be read out.

This competition situation between the read-out operation and the write operation has led to a configuration of the memory 3 which is also known as "ping-pong" implementation in the literature. The memory 3 is subdivided into two memory banks, of which one is provided exclusively for read operations and the other is provided exclusively for write operations.

Although undesirable collisions are reliably avoided with the aid of this technique, the memory 3 must nonetheless have twice the size that would otherwise be necessary, since both memory banks each have to be able to store the path metrics of all states $S_t$ and $S_{t+1}$.

A further problem associated with the storage of the path metrics is the mapping of the path metrics onto the memory, i.e. the assignment of the individual path metrics to the different memory addresses. According to the prior art, this mapping has to be chosen in such a way that different memory areas are used for the read and write operations of the path metricsin order to reliably avoid conflicts between the read and write operations.

The present invention provides a method for storing path metrics in a Viterbi decoder that can be realized with a lower memory requirement and that reliably prevents write/read conflicts.

The method for storing path metrics in a Viterbi decoder is on the principle of a time-variable trellis diagram and is particularly suitable for trellis diagrams having a butterfly structure and corresponding ACS units.

The method according to the invention requires just one memory and enables path metrics to be read from and stored in the same memory areas, i.e. the path metrics of corresponding destination states calculated on the basis of two starting path metrics are stored under the same memory address from which the two starting path metrics were previously read out. The size of the memory is independent of the respectively chosen degree of parallelism of the trellis and merely has to correspond to the product of the number of different trellis states and the number of bits per memory word. In particular, just one memory is necessary even when the path metrics for a plurality of processor elements are intended to be stored in combined form.

The invention requires a minimal amount of area and power consumption of the chip used for Viterbi decoding, since just one memory address is required for two path metrics. The invention is suitable both for feedforward codes, such as, for example, SDSL, and for feedback codes and allows the use of programmable Viterbi decoders, it being possible for the corresponding path metrics to be programmed in a simple manner for each butterfly.

The present invention is explained in more derail below using a preferred exemplary embodiment with reference to the accompanying drawing.

DETAILED DESCRIPTION

Before the details of the present invention are specifically discussed, the nomenclature that will be resorted to later in order to explain the invention shall be briefly presented below.

If a trellis coder having a total memory size of $M_t$ memory words is assumed, a trellis code with $N_{TS}=2^{M_T}$ is obtained, where $N_{TS}$ designates the number of different states in the corresponding trellis diagram. The length of the impulse response for a feedforward code having the code rate ½ is $M_T+1$. The state transitions in the trellis diagram depend, as described, on the respectively coded bit B, the state $S_{t+1}$ at the instant t+1 resulting from the preceding state $S_t$ in accordance with the following relationship:

$$S_{t+1}=(2 \cdot S_t) \bmod(N_{TS}+B)$$

Figure 6:
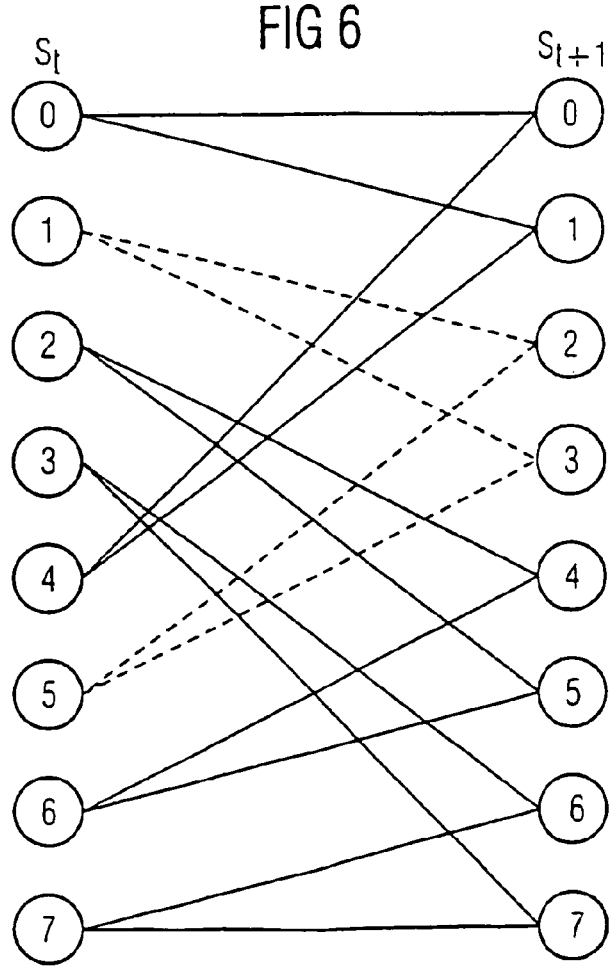
FIG. 6 shows the illustration of a trellis diagram with a butterfly structure for elucidating the problems associated with the prior art.

If the trellis diagram has the butterfly structure which has already been described and is shown by way of example in FIG. 6, each butterfly is allocated two starting states and two destination states, it being possible, in each case with reference to the geometry of the trellis, to distinguish between an upper state designated by the index (u) (for "upper") and a lower state designated by the index (l) (for "lower"). In the case of the butterfly shown by broken lines in FIG. 6, it holds true that, for example, $S_t^{(u)}=1$, $S_t^{(l)}=5$, $S_{t+1}^{(u)}=2$ and $S_{t+1}^{(l)}=3$, where $S_t^{(u)}$ and $S_t^{(l)}$ designate the starting states and $S_{t+1}^{(u)}$ and $S_{t+1}^{(l)}$ designate the destination states of the corresponding butterfly.

As can also be gathered from the illustration of FIG. 6, the lower starting state $S_t^{(l)}$ and the destination states $S_{t+1}^{(u)}$ and $S_{t+1}^{(l)}$ of a butterfly depend on the upper starting state $S_t^{(u)}$, where the following relationships hold true:

$$0 \leq S_t^{(u)} \leq \frac{N_{TS}}{2} - 1$$

$$S_t^{(l)} = S_t^{(u)} + \frac{N_{TS}}{2}$$

$$S_{t+1}^{(u)} = (2 \cdot S_t^{(u)}) \bmod(N_{TS}+0)$$

$$S_{t+1}^{(l)} = (2 \cdot S_t^{(u)}) \bmod(N_{TS}+1) = (2 \cdot S_t^{(l)}) \bmod(N_{TS}+1)$$

Upon evaluation of the above formulae where $N_{TS}=8$ and $S_t^{(u)}=1$, the correct values $S_t^{(l)}=5$, $S_{t+1}^{(u)}=2$ and $S_{t+1}^{(l)}=3$ result for the butterfly illustrated by broken lines in FIG. 6.

The present invention is based on the idea of storing the path metrics of a butterfly, which are calculated for the destination states, under the same memory address from which the corresponding starting path metrics were read out, thereby making it possible to avoid undesirable overwriting of the path metrics in the memory 3. This measure results in a time-dependent variation of the trellis structure, so that the resultant trellis representation can also be designated as a "time varying trellis" (TVT).

Figure 3:
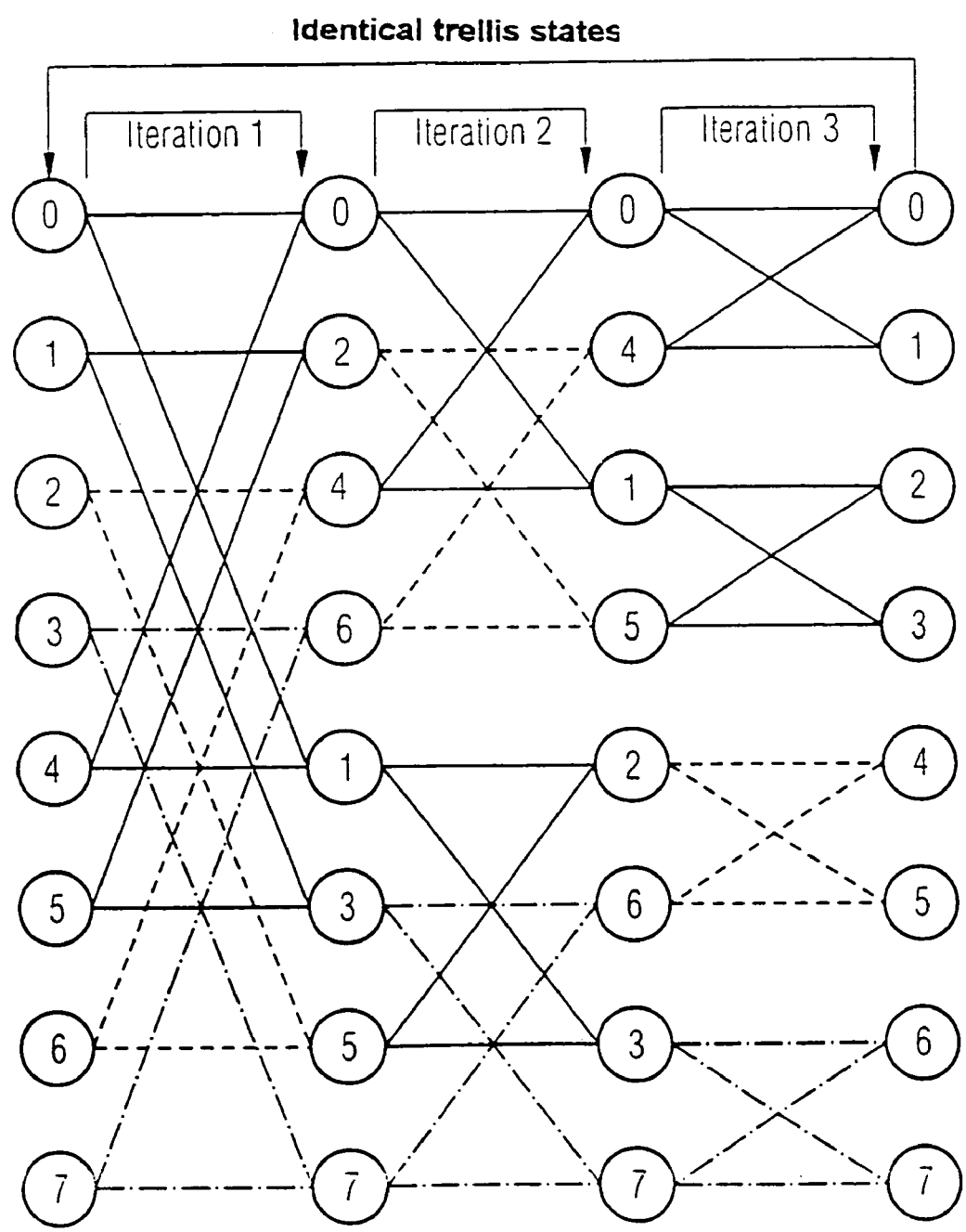
FIG. 3 shows an illustration for elucidating a method from which the method according to the invention proceeds as a development.
Figure 4:
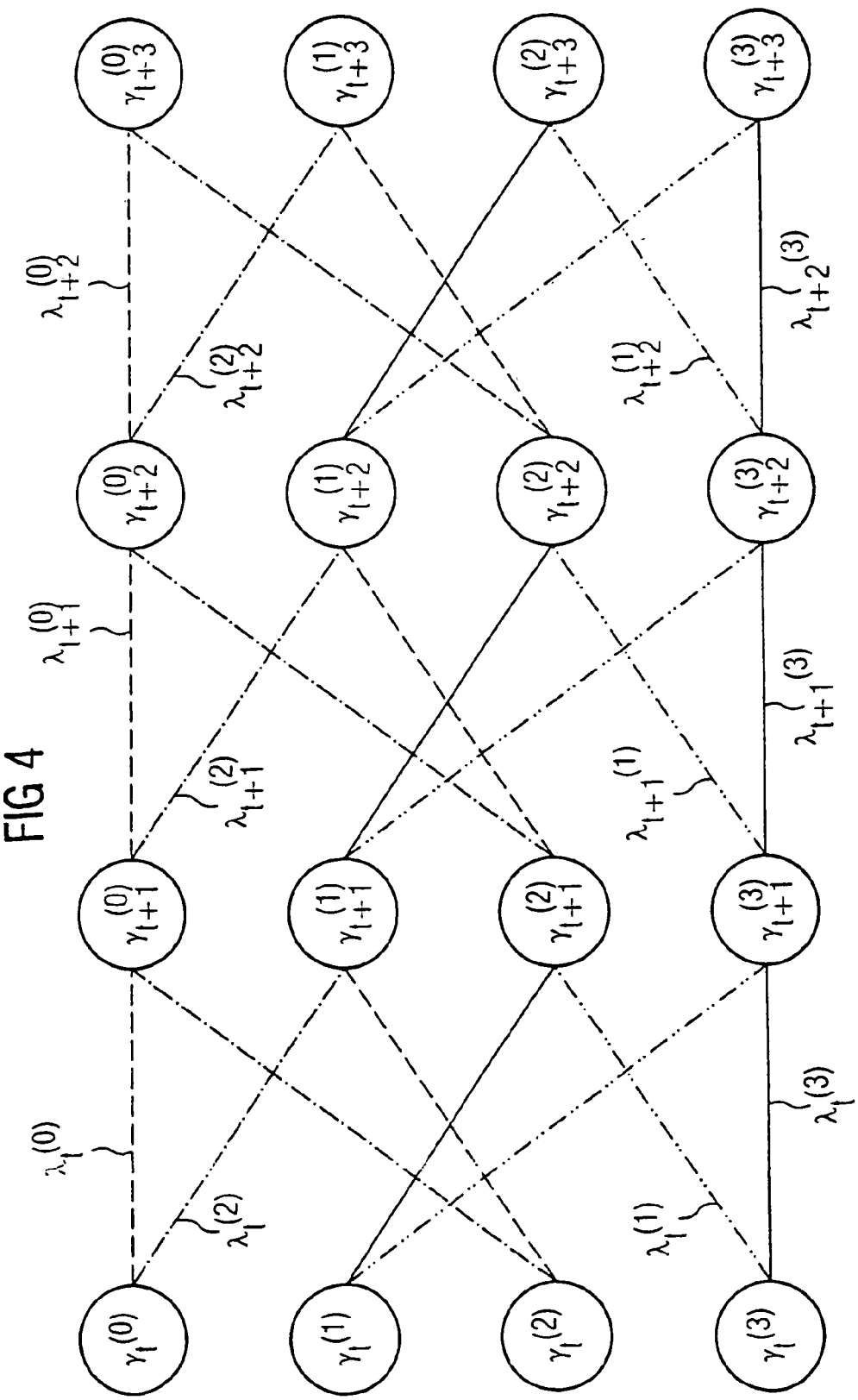
FIG. 4 shows an exemplary trellis diagram with a butterfly structure and four states.
Figure 5:
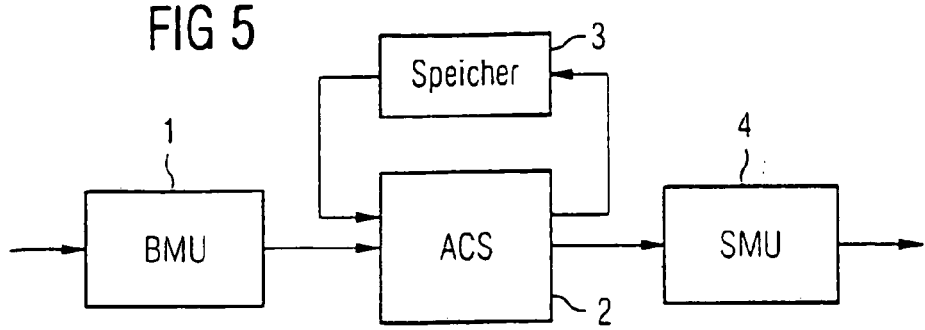
FIG. 5 shows the general construction of a Viterbi decoder.

The TVT of the trellis structure shown in FIG. 6 is illustrated in FIG. 3. As is evident from FIG. 3, although the state transitions of the individual butterflies correspond to the state transitions shown in FIG. 6, with each time step or with each iteration the sequence of the states is reordered in such a way that each destination state of a butterfly is connected to the corresponding starting state of the same butterfly by a horizontal branch. In FIG. 3, two butterflies are illustrated by dashed lines and dash-dotted lines, respectively, for the individual iterations, the butterflies including the starting states No. 2 and No. 6 and, respectively, No. 3 and No. 7 and the destination states No. 4 and No. 5 and, respectively, No. 6 and No. 7, so that the principle of the time-dependent reordering of the trellis structure can be understood in particular using these butterflies.

Each line of the trellis shown in FIG. 3 corresponds to a memory address of the memory 3, so that, for example, the path metrics for the states No. 2, No. 4, No. 1 and No. 2 are successively written to one and the same memory address (third line in the trellis diagram shown in FIG. 3). It can be shown that after $M_t$ iterations (after $M_t=3$ iterations in the example illustrated), the original state sequence is obtained again.

The previously described TVT approach prevents the undesirable overwriting of path metrics in the memory 3, However, there is still the problem that two path metrics must be read and written simultaneously in order to enable the butterfly-structure-based calculation of the path metrics by the ACS unit 2, so that the memory would have to be correspondingly subdivided. It can be shown that this is not possible, however, for the TVT approach.

Therefore, the TVT approach must be developed further to give an approach which does justice to the butterfly structure and will be explained below with reference to FIG. 1 and FIG. 2, and can also be designated as "butterfly oriented time varying trellis" (BFTVT).

The problem essentially associated with the previously described TVT approach is that the path metrics, calculated by the ACS unit 2, of the destination states of a butterfly do not at the same time constitute starting path metrics for a further butterfly. In order to clarify these facts, the starting and destination path metric pairs of a butterfly are represented below in the form $[S_t^{(u)}, S_t^{(l)}]$ and $[S_{t+1}^{(u)}, S_{t+1}^{(l)}]$, respectively. Consequently, the following state transitions result for the individual butterflies of the trellis shown in FIG. 3 (iteration 1).

[0,4]→[0,1]
[1,5]→[2,3]
[2,6]→[4,5]
[3,7]→[6,7]

It is evident that, for example, the destination states [0,1] of the butterfly with the starting states [0,4] do not simultaneously constitute starting states for a common butterfly of the iteration 2. It makes no sense, therefore, to store the starting and destination path metrics of each butterfly in the form of a common memory word.

On the other hand, however, it is clear that, for example, the destination states [0,1] and [4,5] of the two butterflies which have the starting states [0,4] and [2,6] can at the same time be utilized as starting states for subsequent butterflies in the trellis diagram having the starting states [0,4] and [1,5]. It can be proved that all $2^{M_T-1}$ butterflies can be combined in pairs in such a way that the path metrics of the destination states of the butterfly pairs can at the same time be utilized as starting path metrics for two other butterflies, if the path metrics determined for the destination states are correspondingly reordered.

Figure 1:
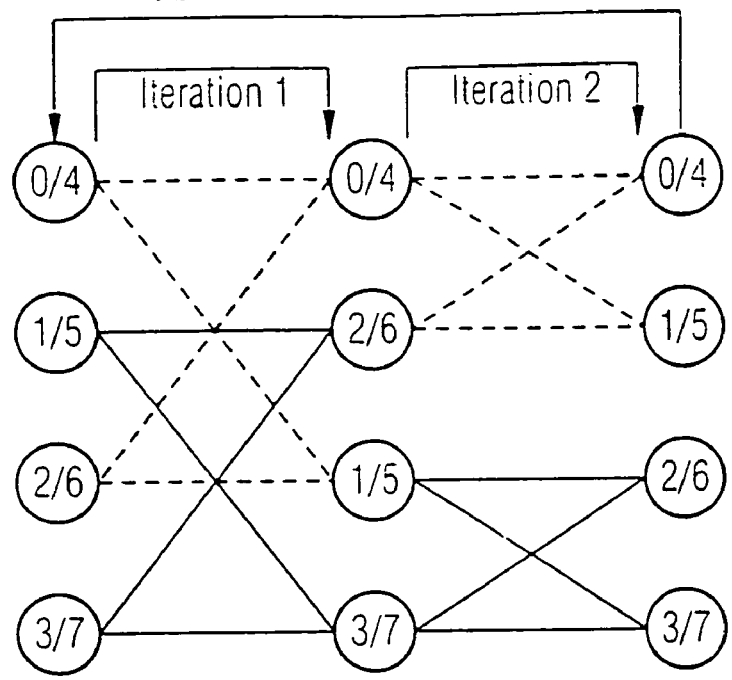
FIG. 1 shows an illustration for elucidating the principle underlying the present invention for an SDSL Viterbi decoder on the basis of a trellis comprising eight states.
Figure 2:
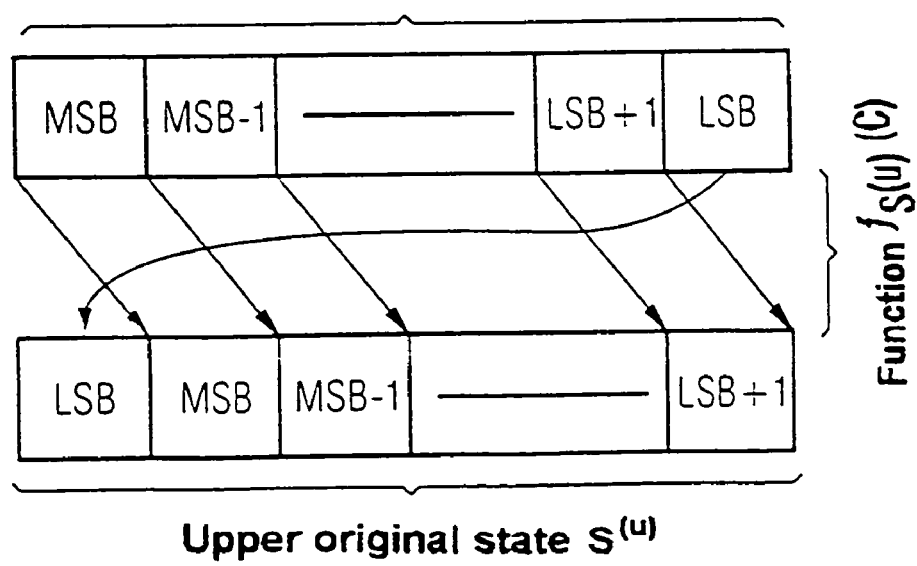
FIG. 2 shows an illustration for elucidating a function which can be used to determine, in a manner dependent on a counter reading, a state which, in accordance with a preferred exemplary embodiment of the invention, is crucial for mapping the individual path metrics onto the different memory addresses of the memory of the ACS unit.

This approach is illustrated in FIG. 1. The word width of each memory word of the memory 3 is doubled compared with the prior art, thereby making it possible to store the results or path metric of the destination states of two butterflies in pairs of at least two path metrics per memory word. In particular, the size of the memory is independent of the number of processor elements used; only the number of write/read operations changes.

In FIG. 1, each circle corresponds to the two starting states or the starting path metrics thereof of a corresponding butterfly in the form $S^{(u)}/S^{(l)}$. Combining the individual butterflies in pairs produces the superordinate butterfly trellis structure shown in FIG. 1, the trellis shown in FIG. 1 defining which path metrics of the destination states of the original butterflies combined in pairs are used as starting path metrics for which subsequent butterflies. Thus, FIG. 1 illustrates, for example, a superordinate butterfly illustrated by broken lines, which, as described, combines the original butterflies with the starting states [0,4] and [2,6], respectively, and the destination states [0,1] and [4,5], respectively, and reorders the resultant destination states in pairs of [0,4] and [1,5], so that these reordered destination state pairs can at the same time serve as starting states for subsequent butterflies (cf. the butterfly structure of FIG. 6, from which it is evident that the starting states [0,4] and [1,5] are respectively assigned to a butterfly).

Furthermore, the superordinate trellis structure thus obtained is constructed analogously to FIG. 3 in the form of a TVT structure. Consequently, each line of the trellis shown in FIG. 1 corresponds to a memory address of the memory 3, so that, for example with regard to the second line of the trellis illustrated, the path metrics of the state pairs [1,5], [2,6] and once again [1,5] are successively stored under one and the same memory address.

As can be gathered from the illustration of FIG. 1, the dimension of the trellis is reduced to $2^{M_T-1}$ states on account of the pairwise combination of the individual butterflies by comparison with FIG. 3, so that the number of iterations which are necessary before the original state sequence is regained is also correspondingly reduced by the value 1 by comparison with FIG. 3. The consequence of this is that the addressing complexity with regard to the address generation for the memory 3 can also be correspondingly reduced.

It has been previously pointed out that all states of a butterfly can be derived from the upper starting state $S^{(u)}$ of this butterfly. The respectively suitable memory address for the path metric pairs shown in FIG. 1 can thus be determined in a relatively simple manner by using a counter whose counter reading C varies between $$\left[0 \ldots \frac{N_{TS}}{2} - 1\right],$$

With the aid of an addressing function $f_{s^{(u)}}(C)$, and in a manner dependent thereon, the upper state $S^{(u)}$ of the butterfly pair respectively corresponding to the instantaneous counter reading C is determined. With the aid of an addressing function $f_{addr}(S^{(u)}, I)$, and in a manner dependent on the determined upper state $S^{(u)}$ and the respective present iteration number I, the suitable memory address is determined. In the case where the path metrics of a plurality of processor elements are to be combined, the counter reading of the counter must vary between $$\left[0 \ldots \frac{N_{TS}}{2^{ld(N_{PE})}} - 1\right],$$

where $N_{PE}$ corresponds to the number of processor elements and $ld(X)$ corresponds to the expression $\log_2(X)$.

The function $f_{s^{(u)}}(C)$ is nonlinear. It can be shown that this function can be realized in the form of a simple bit mapping, as is shown in FIG. 2, where MSB designates the most significant bit and LSB designates the least significant bit.

The addressing function $f_{addr}(S^{(u)}, I)$ can be described on the basis of the properties of a feedforward trellis coder by the following relationship:

$$ADDR=[(2^I \cdot S^{(u)}) \bmod(M_T-1)] + [2^{(I-M_T-1)} \cdot S^{(u)}]$$

In this case, ADDR designates the memory address determined as a function of $S^{(u)}$, $M_T$ and I for the respective path metric pair, where $I \in [0 \ldots M_T-1]$. This addressing function can easily be implemented since it merely corresponds to a $M_T-1$ bit addition of the first and second terms represented, without a possible overflow having to be taken into account. All multiplications within the formula represented can be realized by simple bit shifting operations.

In the case where the invention is to be applied to a plurality of processor elements, the addressing function $f_{addr}(S^{(u)}, I)$ can be described by the following relationship:

$$ADDR=[(2^I \cdot S^{(u)}) \bmod(2^{(ld(N_{TS})-ld(N_{PE})-1)})] + [2^{(ld(N_{PE})-I-ld(N_{PE})-1)} \cdot S^{(u)}]$$

The invention has been explained above with reference to the use of feedforward codes, for example an SDSL code. However, the invention can likewise be applied to feedback codes. Although the trellis structure of a Viterbi decoder for feedback codes differs considerably from that for feedforward codes, it is nonetheless the case for feedback codes, too, that in the trellis butterflies can be combined in pairs in such a way that the corresponding path metrics of the destination states constitute, at the same time, starting path metrics for two successive butterflies in the trellis diagram. In contrast to feedforward codes, the number of iterations which are necessary before the original state sequence occurs again in the trellis diagram does not directly depend on the value $M_T$. For feedback codes, too, in an analogous manner to the procedure described above for feedforward codes, corresponding expressions for $f_{s^{(u)}}(C)$ and $f_{addr}(S^{(u)}, I)$ can be determined, the derivation of which is dispensed with, however, at this point.

The invention claimed is:

1. A method for storing path metrics in a Viterbi decoder, the path metrics being determined using a trellis diagram which is allocated to the Viterbi decoder and in which, in each case, two destination states of a specific time step (t+1) form, with two starting states of a preceding time step (t), a butterfly structure by means of which the corresponding two destination states of the specific time step (t+1) are connected to the two starting states of the preceding time step (t) by means of a respective state transition branch, for each time step (t+1), the path metric ($\gamma_{t+1}$) of each destination state being determined as a function of the path metrics ($\gamma_t$) of those starting states of the preceding time step (t) that form a butterfly structure with the respective destination state, for this purpose the path metrics ($\gamma_t$) of the corresponding two starting states being read from memory means, the path metric ($\gamma_{t+1}$) of the respective destination state of the time step (t+1) being determined as a function thereof and the path metric ($\gamma_{t+1}$) of the respective destination state being stored in the memory means, characterized in that the butterfly structures of the trellis diagram of each time step (t) are combined at least in pairs in such a way that for each butterfly structure pair of a time step (t), the destination states of the two butterfly structures in the trellis diagram at the same time form starting states for two butterfly structures of the subsequent time step (t+1), and characterized in that after the determination of the path metrics of the destination states of the two butterfly structures of a butterfly structure pair, in each case the path metrics of those two destination states of this butterfly structure pair, which at the same time form starting states of a butterfly structure of a subsequent time step (t+1), are stored in the memory means in the form of a common memory word.

2. The method as claimed in claim 1 characterized in that in each case, the path metrics of those two starting states of a time step (t) which belong to the same butterfly structure are stored in the form of a common memory word in the memory means, and characterized in that after the determination of the path metrics of the destination states of the two butterfly structures of a butterfly structure pair, in each case the path metrics of those two destination states of this butterfly structure pair, which at the same time form the starting states of a butterfly structure of the subsequent time step (t+1), are stored in the memory means under the same address as the path metrics of two starting states which form a butterfly structure with one of these two destination states.

3. The method as claimed in claim 1, characterized in that: the path metric ($\gamma_{t+1}$) of each destination state is determined as a function of the path metrics ($\gamma$) of
the two starting states of the corresponding butterfly structure, and
of branch metrics ($\lambda_t$), which are allocated to the two state transition branches of the butterfly structure.

4. The method as claimed in claim 3, characterized in that, in each butterfly structure,
a first branch metric for the state transition branch connecting the first starting state to the first destination state and
the state transition branch connecting the second starting state to the second destination state
are of identical magnitude, and
a second branch metric for the state transition branch connecting the first starting state to the second starting destination state and
the state transition branch connecting the second starting state to the first destination state
are of identical magnitude.

5. The method as claimed in claim 1, characterized in that the method is employed for decoding a signal coded with a feedforward code.

6. The method as claimed in claim 5, characterized in that the method is employed for decoding a symmetric digital subscriber line-coded signal.

7. The method as claimed in claim 1, characterized in that the method is employed for decoding a signal coded with a feedback code.

8. A method for storing path metrics in a Viterbi decoder, the path metrics being determined using a trellis diagram allocated to the Viterbi decoder, the trellis diagram having, in each case
two destination-states associated with a subsequent time-step (t+1) that form, together with two starting states of a preceding time-step (t), a butterfly structure connecting the two destination-states with the two starting-states by means of a respective state transition branch, and
for each subsequent time-step (t+1), a path metric ($\gamma_t+1$) of each destination-state being determined as a function of path metrics ($\gamma_t$) of the two starting-states,
the path metrics ($\gamma_t$) of the corresponding two starting-states being read from a memory,
the path metric ($\gamma_t-1$) of the respective destination-state being determined as a function of the path metrics ($\gamma_t$) of the corresponding two starting-states being read from a memory, and the path metric ($\gamma_t+1$) of the respective destination-state being stored in the memory,
said method comprising:
combining the butterfly structures of the trellis diagram of each preceding time-step (t) at least in pairs such that, for each butterfly structure pair of a preceding time-step (t), the destination-states of the two butterfly structures in the trellis diagram also form starting-states for two butterfly structures of the subsequent time-step (t+1);
determining the path metrics of the destination-states of the two butterfly structures of a butterfly structure pair; and
storing, as a common memory word, the path metrics of those two destination-states of this butterfly structure pair.

9. The method as claimed in claim 8, further comprising:
in each case, storing, as a common memory word, the path metrics of those two starting-states of a preceding time-step (t) that belong to the same butterfly structure;
determining the path metrics of the destination-states of the two butterfly structures of a butterfly structure pair; and
in each case, storing the path metrics of those two destination-states of this butterfly structure pair, under the same address as the path metrics of two starting-states that form a butterfly structure with one of the two destination-states.

10. The method as claimed in claim 8, further comprising determining the path metric ($\gamma_t+1$) of each destination-state as a function of
the path metrics ($\gamma$) of the two starting-states of the corresponding butterfly structure, and
branch metrics ($\lambda_t$) allocated to the two state transition branches of the butterfly structure.

11. The method as claimed in claim 10, further comprising ensuring that in each butterfly structure,
a first branch metric for the state transition branch connecting the first starting-state to the first destination-state and
the state transition branch connecting the second starting-state to the second destination-state
are of identical magnitude, and that
a second branch metric for the state transition branch connecting the first starting-state to the second starting destination-state and
the state transition branch connecting the second starting-state to the first destination-state
are of identical magnitude.

12. The method as claimed in claim 8, further comprising decoding a signal coded with a feedforward code.

13. The method as claimed in claim 12, further comprising decoding a symmetric digital subscriber line-coded signal.

14. The method as claimed in claim 8, further comprising decoding a signal coded with a feedback code.

* * * * *